US009524887B2

United States Patent
Yoo et al.

(10) Patent No.: US 9,524,887 B2
(45) Date of Patent: Dec. 20, 2016

(54) ETCHING APPARATUS FOR SUBSTRATE AND METHOD OF ETCHING USING THE SAME

(71) Applicant: Samsung Display Co., Ltd., Yongin, Gyeonggi-Do (KR)

(72) Inventors: Hae-Young Yoo, Cheonan-si (KR); Pyoung-Kyu Park, Cheonan-si (KR); Woo-Youl Park, Cheonan-si (KR); Min-Kyu Shin, Paju-si (KR); Jung-Kun Shin, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 137 days.

(21) Appl. No.: 13/908,087

(22) Filed: Jun. 3, 2013

(65) Prior Publication Data

US 2014/0190936 A1 Jul. 10, 2014

(30) Foreign Application Priority Data

Jan. 8, 2013 (KR) .......................... 10-2013-0001906

(51) Int. Cl.
*G02F 1/13* (2006.01)
*H01L 21/67* (2006.01)
*H01L 21/673* (2006.01)
*H01L 21/677* (2006.01)

(52) U.S. Cl.
CPC ..... *H01L 21/6708* (2013.01); *H01L 21/67086* (2013.01); *H01L 21/6732* (2013.01); *H01L 21/67051* (2013.01); *H01L 21/67075* (2013.01); *H01L 21/67303* (2013.01); *H01L 21/67313* (2013.01); *H01L 21/67326* (2013.01); *H01L 21/67772* (2013.01)

(58) Field of Classification Search
USPC .... 156/345.11, 345.18, 345.21; 134/92, 155, 134/162, 175, 177, 186, 188, 197, 902
See application file for complete search history.

(56) References Cited

U.S. PATENT DOCUMENTS

| | | | |
|---|---|---|---|
| 5,196,064 A * | 3/1993 | Branderhorst et al. | 118/313 |
| 6,228,211 B1 * | 5/2001 | Jeong | 156/345.11 |
| 6,332,626 B1 * | 12/2001 | Morrill | 280/491.3 |
| 6,488,037 B1 * | 12/2002 | Guldi | 134/1.3 |
| 6,551,443 B2 * | 4/2003 | Doh | 156/345.11 |
| 6,780,277 B2 * | 8/2004 | Yokomizo et al. | 156/345.11 |
| 6,841,083 B2 * | 1/2005 | Scalzo et al. | 216/91 |
| 7,229,521 B2 * | 6/2007 | Ou et al. | 156/345.13 |

(Continued)

FOREIGN PATENT DOCUMENTS

| | | |
|---|---|---|
| JP | 2003-231764 A | 8/2003 |
| KR | 1020050113042 A | 12/2005 |
| KR | 1020120051841 A | 5/2012 |

OTHER PUBLICATIONS

Machine Generated English Translation of KR 10-2012-0051841. published May 23, 2012.*

*Primary Examiner* — Sylvia R MacArthur
(74) *Attorney, Agent, or Firm* — Cantor Colburn LLP

(57) ABSTRACT

An etching apparatus includes a receiving container which receives a substrate, and a first spraying unit which supplies etchant into the receiving container. The receiving container includes a bottom plate, a plurality of bottom through holes defined in the bottom plate and through which the etchant is drained from the receiving container; and a plurality of side walls extended from the bottom plate.

15 Claims, 10 Drawing Sheets

(56) References Cited

U.S. PATENT DOCUMENTS

| | | | |
|---|---|---|---|
| 7,909,932 B2* | 3/2011 | Koeda .................... | B82Y 30/00 118/721 |
| 2005/0016461 A1* | 1/2005 | Klug et al. .................... | 118/726 |
| 2005/0061775 A1* | 3/2005 | Hsu et al. ........................ | 216/83 |
| 2006/0151013 A1* | 7/2006 | Tsuneta et al. ................. | 134/76 |
| 2009/0081881 A1* | 3/2009 | Kiyose .......................... | 438/753 |
| 2012/0031873 A1* | 2/2012 | Bai ........................ | H05K 3/068 216/17 |
| 2014/0190936 A1* | 7/2014 | Yoo et al. ....................... | 216/83 |

* cited by examiner

ETCHING APPARATUS FOR SUBSTRATE AND METHOD OF ETCHING USING THE SAME

This application claims priority to Korean Patent Application No. 10-2013-0001906, filed on Jan. 8, 2013, and all the benefits accruing therefrom under 35 U.S.C. §119, the contents of which are incorporated by reference herein in their entireties.

BACKGROUND

1. Field

Exemplary embodiments of the invention relate to an etching apparatus and a method of etching a substrate using the etching apparatus. More particularly, exemplary embodiments of the invention relate to an etching apparatus for performing a wet etching process and a method of etching using the etching apparatus.

2. Description of the Related Art

Generally, a liquid crystal display device is advantageous in areas of the dimension, weight and the power consumption thereof, so that the liquid crystal display device is used in a display monitor, a laptop computer, a cellular phone, a television and so on.

The liquid crystal display device has been developed in order to reduce and minimize the dimension and/or the weight thereof. There are many methods of reducing the dimension and/or the weight of the liquid crystal display device. Most of all, methods of reducing the weight of the substrate have been researched variously.

SUMMARY

One or more exemplary embodiment of the invention provides an etching apparatus capable of providing a high productivity and a high effect of etching.

One or more exemplary embodiments of the invention further provides a method of etching a substrate using the etching apparatus.

According to an exemplary embodiment of the invention, an etching apparatus includes a receiving container which receives a substrate and includes: a bottom plate, and a plurality of bottom through holes defined in the bottom plate and through which an etchant is drained from the receiving container, and a plurality of side walls extended from the bottom plate; and a first spraying unit which supplies the etchant into the receiving container.

In an embodiment, the etching apparatus may further include an opening and closing driving part configured to open and close the bottom through holes in the bottom plate.

In an embodiment, the first spraying unit may include a supply pipe which is over the bottom plate of the receiving container and supplies the etchant, and a plurality of spraying nozzles connected to the supply pipe to facing the bottom plate of the receiving container.

In an embodiment, the opening and closing driving part may include a plurality of protruding portions configured to be inserted into the bottom through holes in the bottom plate.

In an embodiment, the opening and closing driving part may move up and down with respect to the bottom plate.

In an embodiment, the etching apparatus may further include a settling tank disposed under the receiving container and in which an impurity in the etchant drained from the receiving container is settled, a filter part which is connected with the settling tank and filters the etchant drained from the settling tank, and a storage tank which is connected with the filter part, stores the etchant drained from the filter part and supplies the etchant stored in the storage tank to the first spraying unit.

In an embodiment, the etching apparatus may further include a plurality of side through holes defined in a lower portion of a side wall of the receiving container, and a side supply part which is connected to the side through holes and supplies the etchant through the side through holes to the receiving container.

In an embodiment, the side supply part may include a body part facing a side wall, a plurality of injection portions which is extended from the body part and configured to be inserted into the side through holes, respectively, and a second spraying unit which supplies the etchant to the body part.

In an embodiment, the etching apparatus may further include an opening and closing driving part configured to open and close the bottom through holes in the bottom plate.

In an embodiment, the opening and closing driving part may move up and down with respect to the bottom plate.

In an embodiment, the etching apparatus may further include a settling tank disposed under the receiving container and in which an impurity in the etchant drained from the receiving container is settled, a filter part which is connected with the settling tank and filters the etchant drained from the settling tank, and a storage tank which is connected with the filter part, stores the etchant drained from the filter part and supplies the etchant stored in the storage tank to the first spraying unit.

In an embodiment, the etching apparatus may further include a plurality of side through holes defined in a lower portion of a side wall of the receiving container, and a second spraying unit which is connected to the side through holes and sprays the etchant through the side through holes to the receiving container.

In an embodiment, the second spraying unit may include a supply pipe which is provided be adjacent to the side wall and supplies the etchant, and a plurality of spraying nozzles connected to the supply pipe and configured to engage with the side through holes.

In an embodiment, the etching apparatus may further include an opening and closing driving part including a plurality of protruding portions configured to be inserted into the plurality of bottom through holes of the bottom plate.

In an embodiment, the opening and closing driving part may move up and down with respect to the bottom plate.

In an embodiment, the etching apparatus may further include a settling tank disposed under the receiving container and in which an impurity in the etchant drained from the receiving container is settled, a filter part which is connected with the settling tank and filters the etchant drained from the settling tank, and a storage tank which is connected with the filter part, stores the etchant drained from the filter part and supplies the etchant stored in the storage tank to the first and the second spraying unit.

According to another exemplary embodiment of the invention, the etching apparatus includes a receiving container which receives a substrate and includes: a bottom plate, a plurality of bottom through holes defined in the bottom plate and through which an etchant is drained from the receiving container, and a plurality of side walls extended from the bottom plate; a first inside wall inside the side walls, and a plurality of side through holes defined in a lower portion of the first inside wall and through which etchant is supplied to the receiving container; a second inside wall inside the side walls and facing the first inside wall, and the plurality of side through holes defined in a lower portion of the second inside wall and through which the etchant is supplied to the receiving container; a first spraying unit which supplies the etchant into the receiving container; and a second spraying unit which is adjacent to the first spraying unit, faces a side wall of the receiving container and supplies the etchant into the receiving container.

In an embodiment, the etching apparatus may further include an opening and closing driving part including a plurality of protruding portions configured to be inserted into the plurality of bottom through holes of the bottom plate, and the opening and closing driving part may move up and down with respect to the bottom plate.

In an embodiment, the etching apparatus may further include a settling tank disposed under the receiving container and in which an impurity in the etchant drained from the receiving container is settled, a filter part which is connected with the settling tank and filters the etchant drained from the settling tank, and a storage tank which is connected with the filter part, stores the etchant drained from the filter part and supplies the etchant stored in the storage tank to the first and the second spraying unit.

According to another exemplary embodiment of the invention, a method of etching a substrate using an etching apparatus includes moving an opening and closing driving part of the etching apparatus upward to close bottom through holes defined in a bottom plate of a receiving container of the etching apparatus and through which an etchant is drained from the receiving container; supplying the etchant to the receiving container in a closed state of the bottom through holes to fill the receiving container with the etchant at a predetermined level; moving the opening and closing driving part downward to open the bottom through holes defined in the bottom plate and drain the etchant from the receiving container; supplying the etchant to the receiving container in an open state of the bottom through holes to maintain a level of the etchant at a constant level in the receiving container; and stopping the supplying the etchant to the receiving container and the draining the etchant from the receiving container. The etching apparatus includes: the receiving container including the bottom plate, the bottom through holes defined in the bottom plate, and a plurality of side walls; and the opening and closing driving part including a plurality of protruding portions configured to be inserted into the bottom through holes defined in the bottom plate.

According to one or more exemplary embodiment of the invention, the etching of one or more substrate is performed in the receiving container which functions as an etching bath, and thus a plurality of substrates may be etched simultaneously to improve productivity of an etching process. The receiving container performs multiple functions of receiving the substrate, and transferring the one or more substrate and the etching bath to and from the etching part, and thus a manufacturing cost may be reduced.

In addition, the first spraying unit supplies the etchant from a position over the receiving container, and the second spraying unit supplies the etchant from a position effectively under the receiving container. Thus, the flow of the etchant from and in multiple directions may be generated effectively. Accordingly, the impurities from the etchant drained from the receiving container are not adhered to the one or more substrate by the flow of the etchant in the receiving container, and thus the one or more substrate may be etched effectively.

In addition, the spraying unit and the opening and closing driving part may be controlled such that a uniform and/or continuous flow of the etchant may be contacted with the one or more substrate. Accordingly, the uniformity of the etching may be improved.

BRIEF DESCRIPTION OF THE DRAWINGS

Exemplary embodiments of the invention can be understood in more detail from the following detailed description when taken in conjunction with the accompanying drawings, in which.

DETAILED DESCRIPTION

Figure 1:
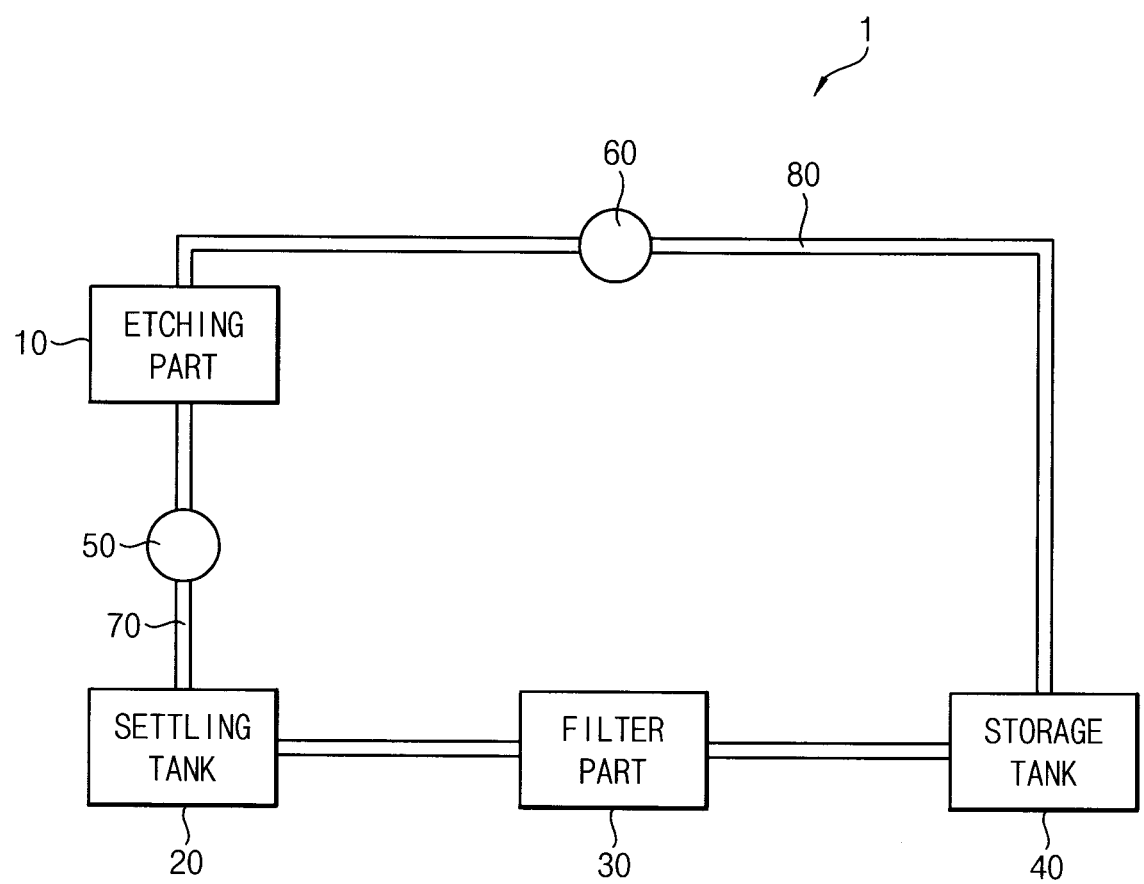
FIG. 1 is a block diagram illustrating an exemplary embodiment of an etching apparatus in accordance with the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to"

another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "under," "above," "over," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" or "lower" relative to other elements or features would then be oriented "over" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

In reducing the dimension and/or the weight of a liquid crystal display device, and specifically, reducing the weight of a substrate of the liquid crystal display device, a slimming technology is generally used. The slimming technology includes a mechanical polishing and a chemical etching. The mechanical polishing was used in the early development of display devices. However, in the later development of display devices, the chemical etching is widely used according to needs of slim or ultra-slim products.

The chemical etching uses a fluoride acid (HF) solution as an etchant to etch the substrate, such as a glass substrate. The chemical etching includes diffusing the etchant, adhering the etchant to the glass substrate, a chemical reaction between the etchant and the glass substrate and removing products of the chemical reaction.

The chemical etching is classified as a deeping method, a spraying method and a jet flowing method according to supplying of the etchant and/or diffusing of the reaction products.

The deeping method etches the glass substrate by filling the etchant in an etching bath, so that multiple glass substrates may be etched simultaneously. However, the products of the chemical reaction remain in the etching bath, so that the reaction products may adhere to a surface of the glass substrates. In addition, an amount of the glass substrates is limited and a relatively large quantity of the etchant is needed.

The spraying method is more developed than the deeping method. The spraying method etches the glass substrate by spraying the etchant on the glass substrate such as using nozzles. As the etchant is sprayed to the glass substrate, such as in a vertical direction relative to the glass substrate, the reaction products may be rapidly removed. Thus, a high quality etching may be obtained by the spraying method as compared to the deeping method.

However, the spraying method treats one glass substrate at a time, and thus productivity of a process of etching the substrates is low. In addition, the spraying method sprays the etchant directly to the glass substrate, and thus the glass substrate may be damaged by an impulse during application of the etchant onto the substrate.

The jet flowing method is a method formed by a combination of the deeping method and the spraying method. After the glass substrate is deposited to the etching bath filled with the etchant, the glass substrate is etched by flow of the etchant. Thus, the jet flowing method may have a high productivity. However, the jet flowing method may be disadvantageous in that an initial investment cost for equipment and the like is high.

Hereinafter, exemplary embodiments of the invention will be explained in detail with reference to the accompanying drawings.

Figure 2:
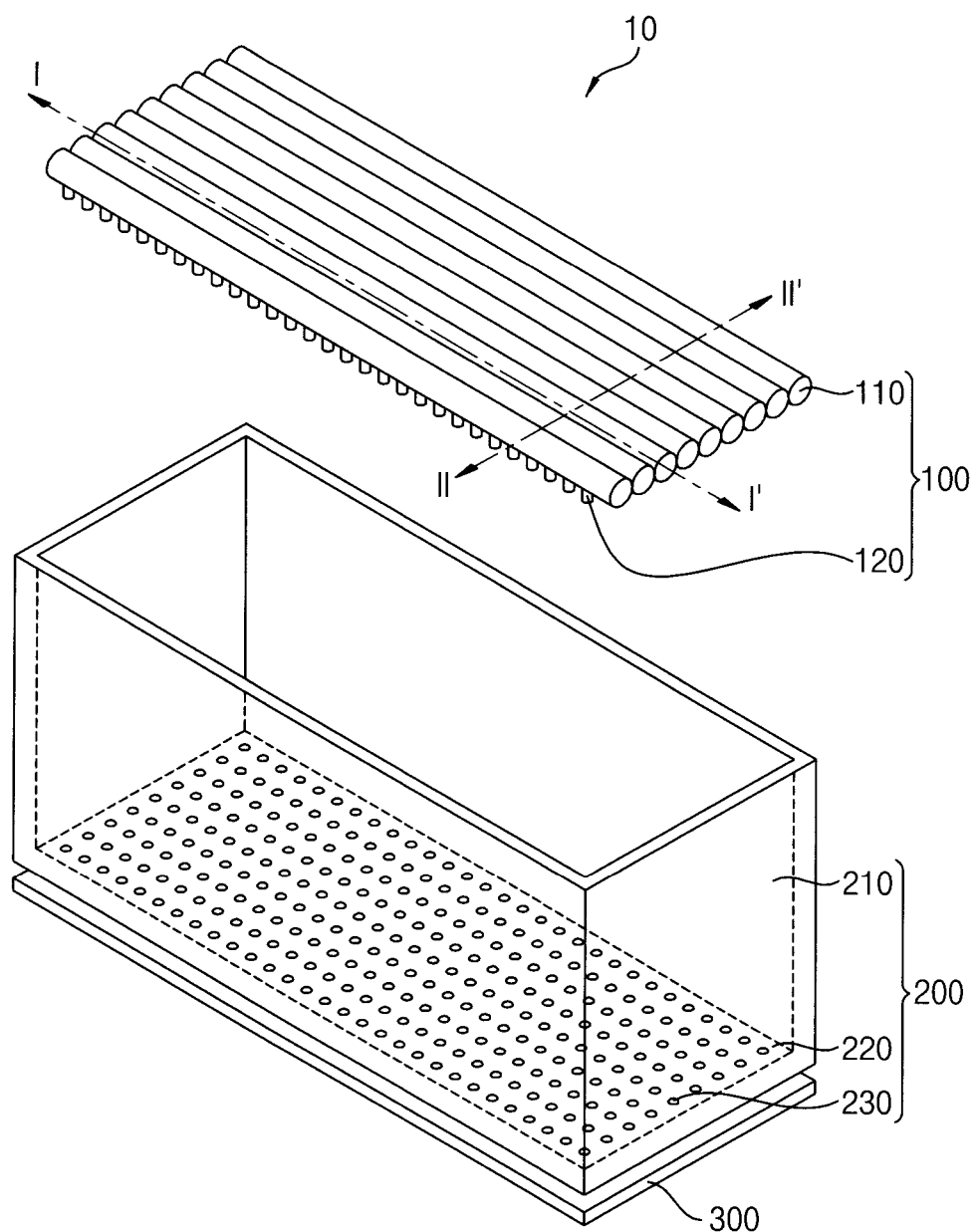
FIG. 2 is a perspective view illustrating an exemplary embodiment of the etching part of FIG. 1.

FIG. 1 is a block diagram illustrating an exemplary embodiment of an etching apparatus in accordance with the invention. FIG. 2 is a perspective view illustrating an exemplary embodiment of the etching part of FIG. 1.

Referring to FIG. 1, an exemplary embodiment of an etching apparatus 1 includes an etching part 10, a settling tank 20, a filter part 30, a storage tank 40, a first pump 50 and a second pump 60.

The etching part 10 is a part in which a substrate is etched. Detailed descriptions regarding the etching part 10 will be explained later.

The settling tank 20 may disposed under a receiving container of the etching part 10. The settling tank 20 receives an etchant that is drained from the etching part 10. The etchant drained from the etching part 10 may include any chemical that is used in an etching process to etch the substrate. The etchant drained from the etching part 10 may also include impurities such as sludge and the like. Relatively big and heavy impurities settle in the settling tank 20, before the impurities are filtered in the filter part 30. The settling tank 20 uses a difference of the specific gravity between the impurities and other portions of the etchant drained from the etching part 10, and therefore, the relatively big and heavy impurities of the etchant drained from the etching part 10 settle such as in the bottom of the settling tank 20. The settled impurities in the etchant drained from the etching part 10 are transferred to the filter part 30.

The etching part 10 is fluidly, physically and/or electrically connected to the settling tank 20 by a first transfer pipe 70. The first pump 50 may be disposed in the first transfer pipe 70, such as connected to a flow path of the first transfer pipe 70, to effectively drain the etchant from the etching part 10. In addition, the flow of the etchant in the etching part 10 may be expedited due to the first pump 50 in the first transfer pipe 70. Alternatively, the first pump 50 may be omitted for simplicity. Where the first pump 50 is omitted, the etchant may free fall from the etching part 10 due to gravity, since the settling tank 20 is under the etching part 10.

The filter part 30 may be fluidly, physically and/or electrically connected with the settling tank 20. The filter part 30 filters the etchant discharged from the settling tank 20. After the etchant discharged from the settling tank 20 is filtered in the filter part 30, the filtered etchant is transferred to the storage tank 40. Then, the filtered etchant is supplied from the storage tank 40 to the etching part 10. Accordingly, the etchant may be used again. In this embodiment, the filter part 30 filters the etchant discharged from the etching part 10 and the settling tank 20, and thus the etchant may be supplied consistently. An etchant may be supplied and drained consistently or substantially constantly to form a flow of the etchant into and through the etching part 10.

After the etchant is filtered in the filter part 30, the filtered etchant flows into the storage tank 40. The storage tank 40 may be fluidly, physically and/or electrically connected with the filter part 30. The etchant is transferred from the storage tank 40 to the etching part 10, to thereby recycle the etchant. The storage tank 40 is connected to the etching part 10 by a second transfer pipe 80. A second pump 60 may be disposed in the second transfer pipe 80 such as connected to a flow path of the second transfer pipe 80 to pump the etchant from the storage tank 40. Accordingly, the etchant may be effectively transferred to the etching part 10. The etchant may be transferred to the etching part 10 with a relatively high pressure, and thus the flow of the etchant may be effectively generated in the etching part 10 while the impurities may be rapidly drained through a lower portion of the etching part 10.

Referring to FIG. 2, an exemplary embodiment of the etching part 10 includes a first spraying unit 100, a receiving container 200, and an opening and closing driving part 300. Each of the first spraying unit 100, the receiving container 200 and the opening and closing driving part 300, may be provided separately from the other components of the etching part 10. That is, the each of these components may be engaged with and disengaged from each other.

The first spraying unit 100 is disposed in the receiving container 200 to supply the etchant into the receiving container 200. The first spraying unit 100 may include a plurality of supply pipes 110, and a plurality of spraying nozzles 120 fluidly, physically and/or electrically connected to the supply pipe 100. While an individual supply pipe and an individual spray nozzle is labeled as 110 and 120, respectively, reference numerals 110 and 120 may also collectively refer to the plurality of supply pipes and the plurality of nozzles.

The supply pipes 110 supply the etchant from the storage tank 40 to the receiving container 200. The supply pipes 110 are elongated to extend in a first (e.g., horizontal) direction and each have a cylindrical shape. The supply pipes 110 may be disposed side by side along a second direction inclined with respect to the first direction, such as perpendicular to the first direction. The supply pipes 110 may contact each other or be spaced apart, such as uniformly spaced apart, in the second direction. Thus, the supply pipes 110 may uniformly supply the etchant to the receiving container 200. The shape of the supply pipe 110 is not limited as a cylindrical shape. Various shapes capable of uniformly supplying etchant to the receiving container 200 may be applicable.

The spraying nozzles 120 are disposed at and connected to a lower portion of the supply pipe 100. The spraying nozzles 120 face a bottom face of the receiving container 200. The plurality of spraying nozzles 120 is respectively connected to the supply pipes 110, and thus, the supply pipes 110 may uniformly supply the etchant to the receiving container 200.

The receiving container 200 includes a side wall 210 and a bottom plate 220. The receiving container 200 may receive an object such as a substrate to be etched and may transfer the object to and/or from the etching part 10. The receiving container 200 according to this illustrated embodiment provides a receiving space in which an etchant is supplied onto the substrate to perform an etching process. That is, the receiving container 200 according to this illustrated embodiment serves as an etching bath. The side wall 210 extends in a vertical direction from the bottom plate 220 to form the receiving space. As used herein, reference numeral 210 may collectively refer to the four side walls extended in the vertical direction from the bottom plate 220, as illustrated in FIG. 2. In this illustrated embodiment, the receiving container 200 may have an overall rectangular parallelepiped shape, however, the shape of the receiving container 200 is not limited thereto. Various shapes of the receiving container 200 capable of receiving the etchant may be applicable.

A plurality of bottom through holes 230 are defined in the bottom plate 220. The bottom through holes 230 may be opened or closed by the opening and closing driving part 300. When the bottom through holes 230 are opened, the etchant passes through the through holes 230 to be drained from the receiving container 200. When the bottom through holes 230 are closed, passage of etchant from the receiving container 200 is restricted or blocked.

The opening and closing driving part 300 is disposed under the receiving container 200, such as in a direction of gravity relative to the receiving container 200. The opening and closing driving part 300 includes a plate 310 and a protruding portion 320 (refer to FIG. 4). The opening and closing driving part 300 moves up and down (e.g., in the vertical direction) to open and close the bottom through holes 230 in the bottom plate 220. When the opening and closing driving part 300 moves up (e.g., towards the receiving container 200), the bottom through holes 230 are closed. When the opening and closing driving part 300 moves down (e.g., away from the receiving container 200), the bottom through holes 230 are opened. When the bottom through holes 230 of the bottom plate 220 are opened, the etchant is drained from the receiving container 200. The opening and closing driving part 300 repeatedly moves up and down, and thus the flow of the etchant in the receiving container 200 may be generated. Accordingly, the impurities are not adhered to the substrate by the flow of the etchant in the receiving container 200, and thus the substrate may be etched effectively.

Figure 3A:
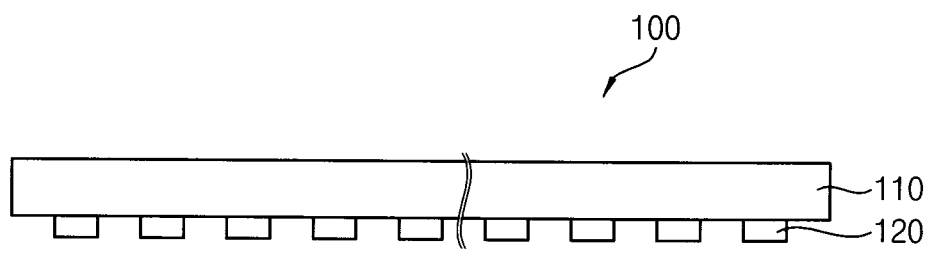
FIG. 3A is a cross-sectional view taken along line I-I' of FIG. 2.
Figure 3B:
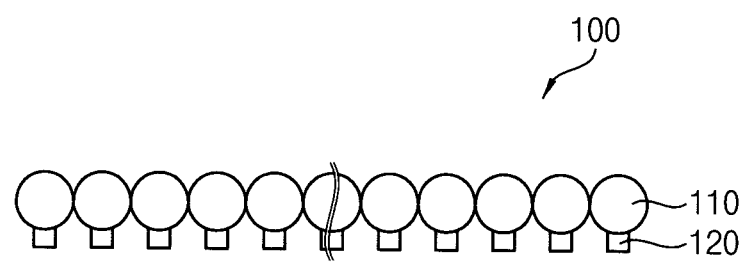
FIG. 3B is a cross-sectional view taken along line II-II' of FIG. 2.

FIG. 3A is a cross-sectional view taken along line I-I' of FIG. 2. FIG. 3B is a cross-sectional view taken along line II-II' of FIG. 2.

Referring to FIGS. 3A and 3B, the first spraying unit 100 includes a supply pipe 110, and a plurality of the spraying nozzles 120 connected to the supply pipe 110. The spraying nozzles 120 spray the etchant to spread a stream of the etching to have a spray shape, such as a fan shape. The first spraying unit 100 includes an individual supply pipe 110 and a plurality of spraying nozzles 120 connected to the individual supply pipe 110, and thus the first spraying unit 100 may uniformly supply the etchant to the receiving container 200. In addition, the spraying nozzles 120 spray the etchant with the spray shape, and thus the spraying nozzles 120 may widely spray the etchant to increase an area in which the etchant is applied. Accordingly, the spraying nozzles 120 spray the etchant to the surface of the substrate, and thus the impurities may be flushed.

Figure 4:
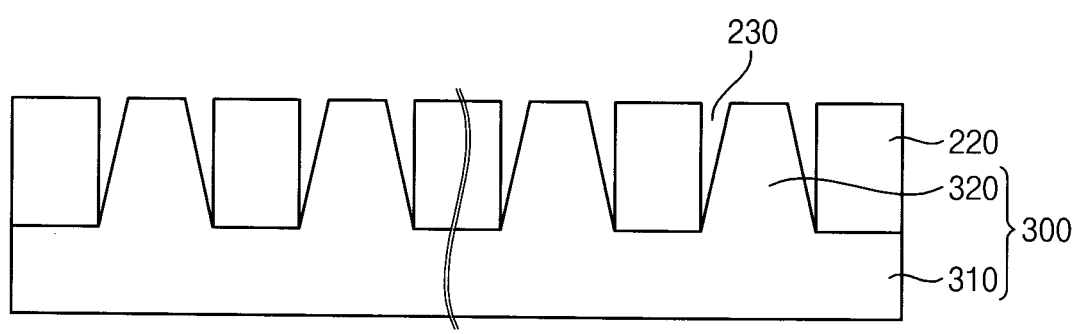
FIG. 4 is a cross-sectional view illustrating an exemplary embodiment of a closed state of a bottom plate of an etching part according to the invention.
Figure 5:
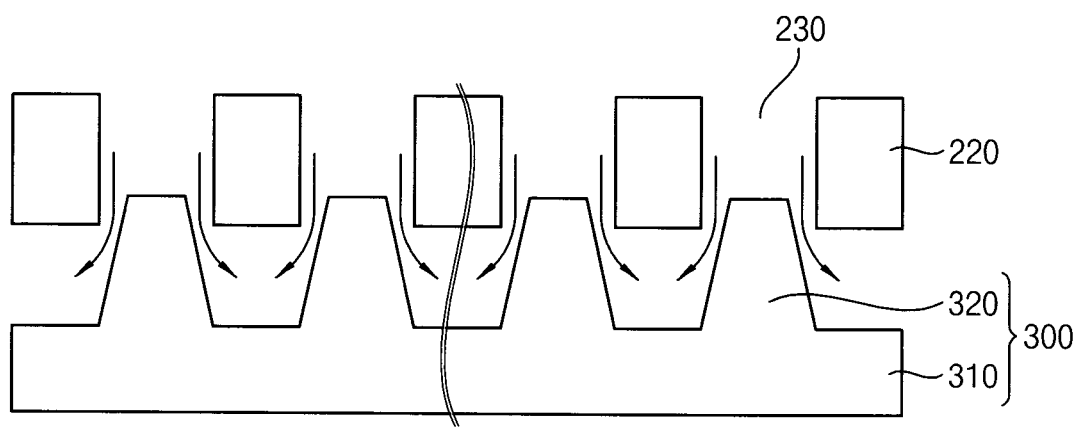
FIG. 5 is a cross-sectional view illustrating an exemplary embodiment of an opened state of a bottom plate of an etching part according to the invention.

FIG. 4 is a cross-sectional view illustrating an exemplary embodiment of a closed state of a bottom plate of an etching part according to the invention. FIG. 5 is a cross-sectional view illustrating an exemplary embodiment of an opened state of a bottom plate of an etching part according to the invention.

Referring to FIG. 4, the bottom through holes 230 defined in the bottom plate 220. A portion of the opening and closing driving part 300 is inserted into the bottom through holes 230. The opening and closing driving part 300 may include the plate 310 and the protruding portion 320. The protruding portion 320 may include a plurality of protrusions extended from the plate 310. The protruding portion 320 is configured to open and close the bottom through holes 230 defined in the bottom plate 220. The protruding portion 320 and the plate 310 may be a single, unitary, indivisible member, but not limited thereto. The opening and closing driving part 300 may move up and down with respect to the bottom through holes 230 defined in the bottom plate 220.

The opening and closing driving part 300 may move up to close the bottom through holes 230 in the bottom plate 220. As illustrated in FIG. 4, a portion of the protrusions of the protruding portion 320 is in the bottom through holes 230. When substantially a whole of the protrusion is in the bottom through hole 230, the bottom through hole 230 may be closed. An upper surface of the plate 310 may be adjacent to and/or contacting a lower surface of the bottom plate 220, to close the bottom through holes 230 in cooperation with the protrusions respectively inserted into the bottom through holes 230. Alternatively, the upper surface of the plate 310 may be adjacent to and/or contacting a lower surface of the bottom plate 220 may be used alone to close the bottom through holes 230.

The opening and closing driving part 300 may move down to open the bottom through holes 230 in the bottom plate 220. As illustrated in FIG. 5, the protrusions of the protruding portion 320 are only partially in the bottom through holes 230, such that there is a gap between the protrusions and inner walls of the bottom through holes 230. This gap provides a flow path for the etchant from the receiving container 200 and in the bottom through holes 230 to an outside of the bottom through holes 230, as illustrated by the arrows. Accordingly, as the bottom through holes 230 in the bottom plate 220 are opened, the etchant is drained from the receiving container 200.

The opening and closing driving part 300 may include the plate 310 and the protruding portion 320. Because the plate 310 is engaged with the bottom plate 220 of the receiving container 200 to close the bottom through holes 230, the plate 310 has a substantially similar and corresponding shape as that of the bottom plate 220. The protrusions of the protruding portion 320 have a corresponding shape to that of the inner dimensions of the bottom through holes 230, and thus the protruding portion 320 is engaged with the bottom through hole 230 to close the bottom through holes 230 in the bottom plate 220.

In order to insert the protrusion of the protruding portion 320 into the bottom through hole 230, a size or dimension of the upper portion of the protruding portion 320 may be smaller than a size or dimension of the bottom through hole 230. The size of the lower portion of the protruding portion 320 may be equal to or smaller than the size of the bottom through hole 230.

When the opening and closing driving part 300 moves up, the bottom through holes 230 in the bottom plate 220 are closed. The protruding portion 320 of the opening and closing driving part 300 is inserted into the bottom through hole 230 of the bottom plate 220, to close the bottom plate 220. Accordingly, when the bottom plate 220 is closed, the etchant may not be drained from the receiving container 200.

Referring to FIG. 5, the opening and closing driving part 300 moves down to be separated by a predetermined space from the bottom plate 220. The protrusion of the protruding portion 320 may have a trapezoidal cross-sectional shape, but is not limited thereto. A cross-sectional width of the protruding portion 320 gradually decreases in a direction from the lower portion to the upper portion thereof. The width of the protrusion of the protruding portion 320 at the distal first end of the protrusion may be smaller than the width at the opposing second end. Accordingly, the opening of the bottom through holes 230 of the bottom plate 220 may be dependent on whether the opening and closing driving part 300 moves down or not. The protruding portion 320 may not be completely separated from the bottom through hole 230 to open the bottom through hole 230. Alternatively, when the protrusion of the protruding portion 320 has a rectangular cross-sectional shape, the protruding portion 320 may be completely separated from the bottom through hole 230 to open the bottom through hole 230 of the bottom plate 220. In the illustrated embodiment of FIG. 4 and FIG. 5, since the protruding portion 320 has a trapezoidal cross-sectional shape, although the protruding portion 320 is not completely separated from the bottom through hole 230, the bottom through holes 230 of the bottom plate 220 may be opened.

In addition, a degree of opening the bottom plate 220 may be varied in proportion to a distance which the opening and closing driving part 300 moves down. The opening and closing driving part 300 is controlled to move away from the bottom plate 220 such that the amount of the etchant drained from the bottom through holes 230 of the bottom plate 220 is controlled. Thus, the speed of the etchant drained from the bottom through holes 230 of the bottom plate 220 may be controlled. The amount and the speed of the etchant drained from the bottom through holes 230 of the bottom plate 220 are controlled to thereby improve the efficiency of the etching of the substrate.

Hereinafter, an exemplary embodiment of a method of etching a substrate using the etching apparatus in FIG. 1 will be explained in detail.

Figure 6:
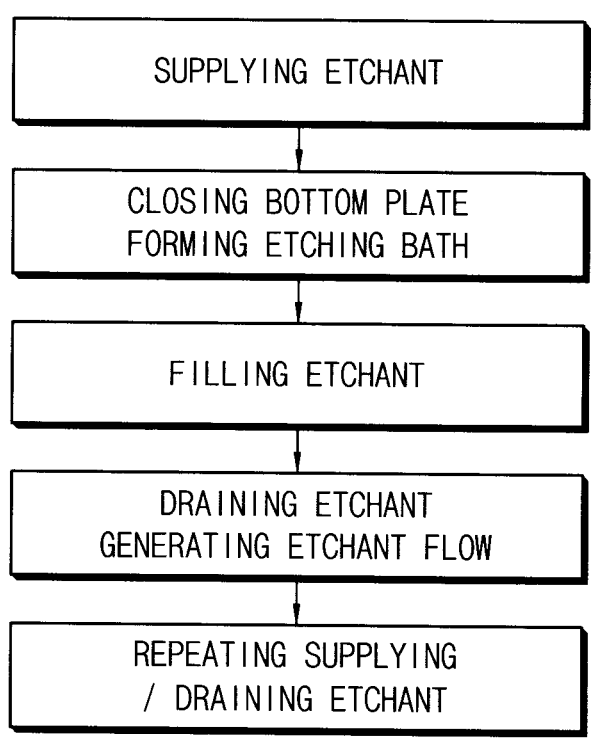
FIG. 6 is a flow chart illustrating an exemplary embodiment of a method of etching a substrate using an etching apparatus in accordance with the invention.
Figure 7:
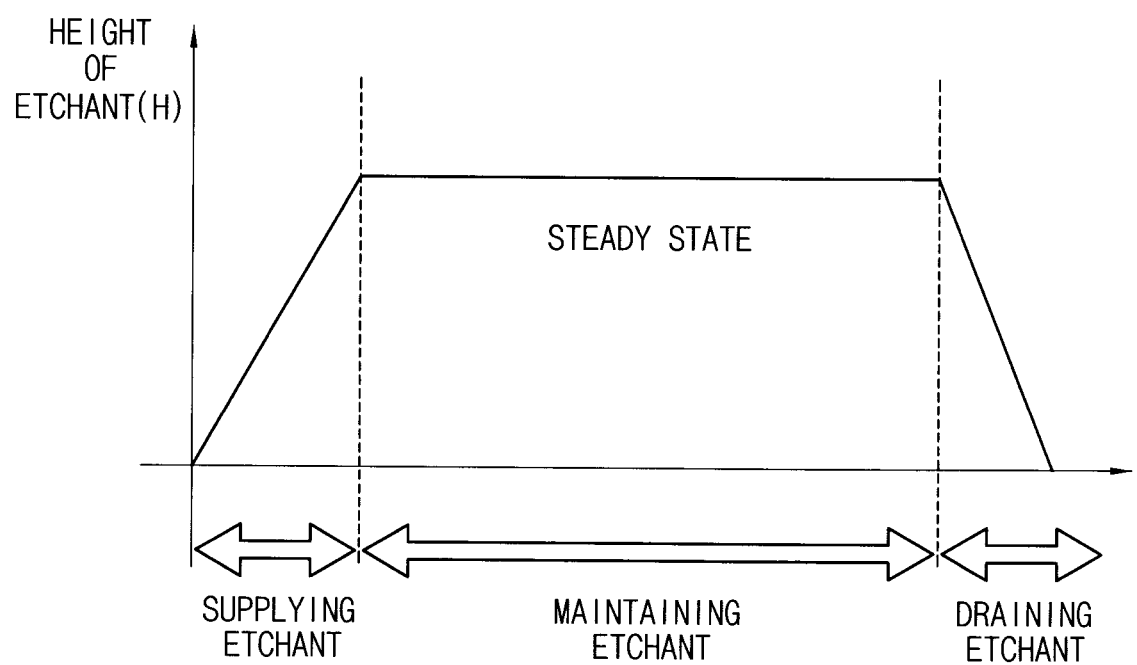
FIG. 7 is a graph illustrating a relationship of a height (e.g., depth) of the etchant in an etching bath with respect to a method of etching using an etching apparatus including the etching bath.

FIG. 6 is a flow chart illustrating an exemplary embodiment of a method of etching a substrate using an etching apparatus in accordance with the invention. FIG. 7 is a graph illustrating a relationship of a height (e.g., depth) of the etchant in an etching bath with respect to a method of etching using an etching apparatus including the etching bath.

Referring to FIGS. 1, 2 and 6, an exemplary embodiment of a method of etching a substrate using the etching apparatus according to the invention includes supplying an etchant to the receiving container 200, closing the bottom plate 220 of the receiving container 200 to form the etching bath, filling the receiving container 200 with the etchant, opening the bottom plate 220 to drain the etchant from the receiving container 200 and generate a flow of the etchant, and repeating the supplying of the etchant and the draining of the etchant. The closing the bottom plate 220 stops a previous flow of the etchant, while draining the etchant restarts the flow.

One or more substrates is received in the receiving container 200 of the etching part 10. Before the receiving container 200 is assembled with other components of the etching part 10, the receiving container 200 may be loaded into a chamber (not shown) for performing a rinsing process, so that the rinsing process may be performed on the one or more substrate in the receiving container 200. This rinsing chamber may be a component of the etching part 10 or may be a totally separate element which is not a component of the etching part 10. After the rinsing process, the receiving container 200 may be assembled with the other components of the etching part 10.

The first spraying unit 100 may supply an etchant to the receiving container 200. The spraying nozzles 120 spray the etchant such that the etchant may be supplied uniformly on an entire surface of the one or more substrate in the receiving container 200.

When the first spraying unit 100 begins to supply the etchant to the receiving container 200, the opening and closing driving part 300 moves up to close the bottom through holes 230 defined in the bottom plate 220 of the receiving container 200. The receiving container 200 serves as an etching bath which is formed by the closing of the bottom through holes 230. After the bottom through holes 230 in the bottom plate 220 of the receiving container 200 is closed, the receiving container 200 is filled with the etchant by the first spraying unit 100.

When the one or more substrate is submerged in the etchant, the bottom through holes 230 in the bottom plate 220 of the receiving container 200 are opened. The etchant is drained through the bottom through holes 230, and thus the flow of the etchant is generated in the receiving container 200. With the flow of the etchant in the receiving container 200, impurities in the etchant drained from the receiving container 200 may also be drained from the receiving container 200. Accordingly, the impurities are not adhered to the one or more substrate by force of the flow of the etchant in the receiving container 200, and are effectively removed from the receiving container 200. Accordingly, the one or more substrate may be etched effectively.

When the bottom through holes 230 are opened and the etchant is drained from the receiving container 200, the etchant is supplied consistently through the first spraying unit 100. At this time, the amount of the etchant supplied and drained is controlled to maintain the amount of the etchant received in the receiving container 200 at a constant level. The etchant is drained from the receiving container 200, and then, is transferred to the settling tank 20, the filter part 30 and the storage tank 40 sequentially. The etchant stored in the storage tank 40 is supplied to the receiving container 200 by the second pump 60. The etchant is recycled, and thus the supplying and the draining of the etchant may be performed consistently.

In addition, the degree of opening the bottom plate 220 may be varied in proportion to a distance which the opening and closing driving part 300 moves down and away from the bottom plate 220. A distance at which the opening and closing driving part 300 moves is controlled such that the amount of the etchant drained from the receiving container 200 and through the bottom through holes 230 of the bottom plate 220 is controlled. The amount and the speed of the etchant drained through the bottom through holes 230 of the bottom plate 220 are controlled to thereby improve the efficiency of the etching of the one or more substrate.

Referring to FIG. 7, the etching process may include a first operation of supplying the etchant, a second operation of maintaining the etchant and a third operation of draining the etchant.

In the operation of supplying the etchant, a height (e.g., depth) of the etchant in the receiving container 200 is increased at a constant rate. The opening and closing driving part 300 moves up to close the bottom through holes 230 defined in the bottom plate 220 and form the etchant bath. Accordingly, in this operation, the etchant is not drained from the receiving container 200. After the receiving container 200 is filled with a desired depth the etchant, the opening and closing driving part 300 moves down to open the bottom through holes 230 defined in the bottom plate 220. Accordingly, the etchant is drained from the receiving container 200 through the bottom through holes 230 defined in the bottom plate 220.

In the operation of maintaining the etchant, the supplying and the draining of the etchant are performed simultaneously. Accordingly, the amount (e.g., depth) of the etchant may be maintained at a constant level ('STEADY STATE' in FIG. 7) in the receiving container 200.

The etchant drained from the receiving container 200 is transferred to the settling tank 20, the filter part 30 and the storage tank 40 sequentially. The etchant stored in the storage tank 40 is supplied to the receiving container 200 by pumping force of the second pump 60. The etchant is rotated and cycled through the components of the etching apparatus 1, and thus the supplying and the draining of the etchant may be performed consistently.

In addition, the degree of opening the bottom through holes 230 in the bottom plate 220 may be varied in proportion to a distance which the opening and closing driving part 300 moves down away from the bottom plate 220. The distance the moving of the opening and closing driving part 300 moves is controlled such that the amount of the etchant drained from the bottom through holes 230 of the bottom plate 220 is controlled. The amount and the speed of the etchant drained from the bottom through holes 230 of the bottom plate 220 are controlled to thereby improve the efficiency of the etching of the substrate. This process is performed repeatedly until the etching is finished.

In the operation of draining the etchant, the supplying of the etchant is stopped, and then, the bottom through holes 230 of the bottom plate 220 are open. Accordingly, the height of the etchant is decreased at a constant rate.

Figure 8:
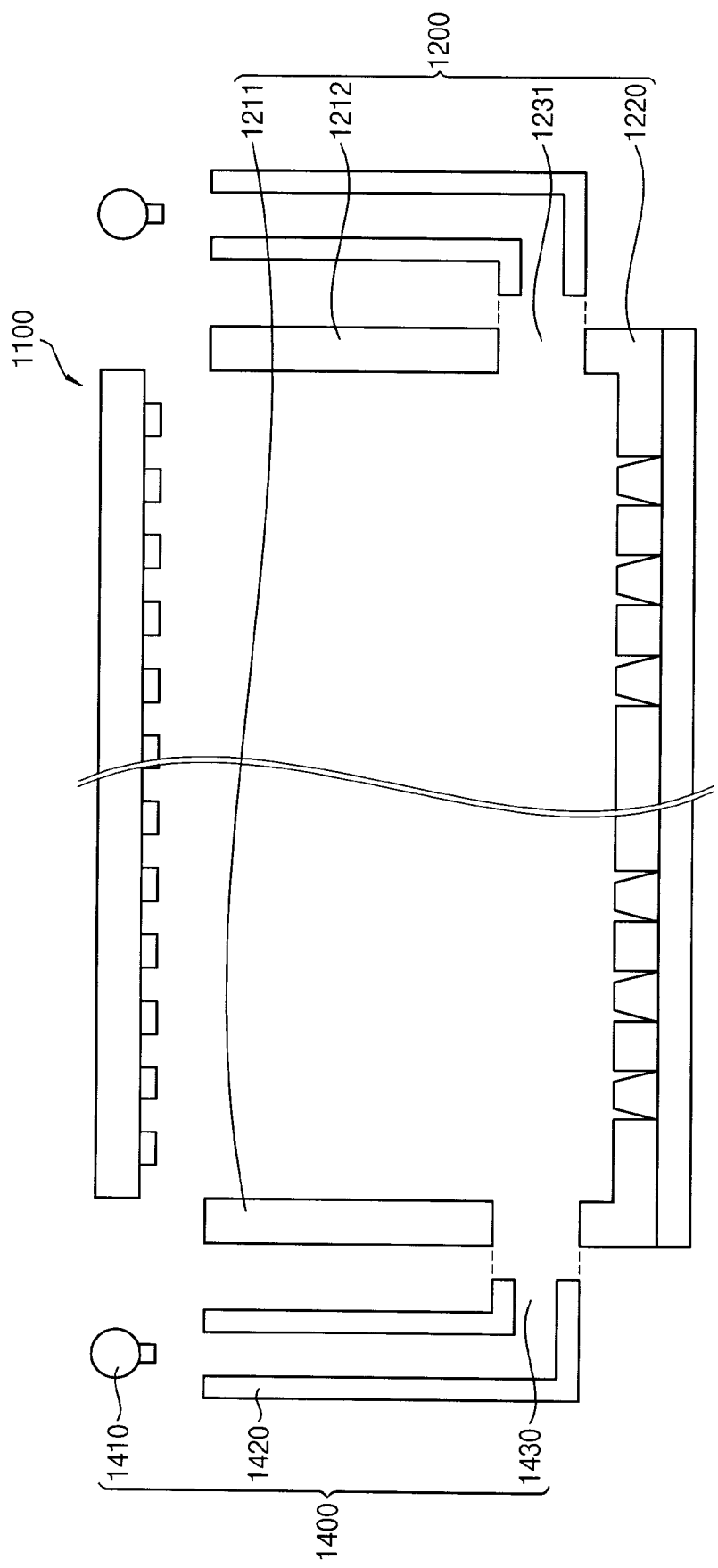
FIG. 8 is a cross-sectional view illustrating another exemplary embodiment of an etching part in accordance with the invention.
Figure 9:
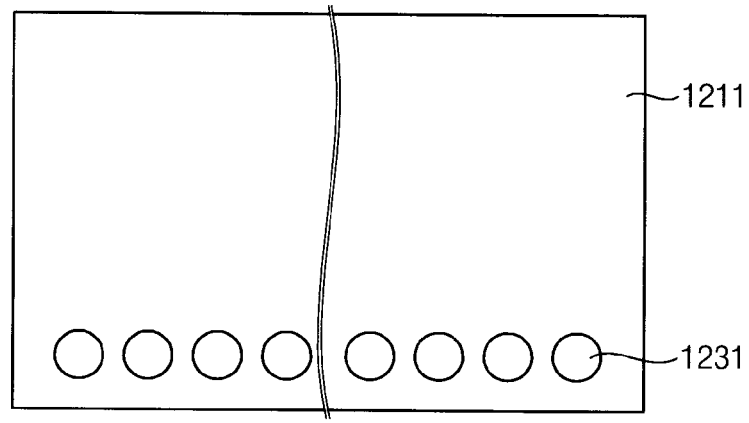
FIG. 9 is a front view illustrating an exemplary embodiment of a first side wall of a receiving container in the etching part of FIG. 8.
Figure 10:
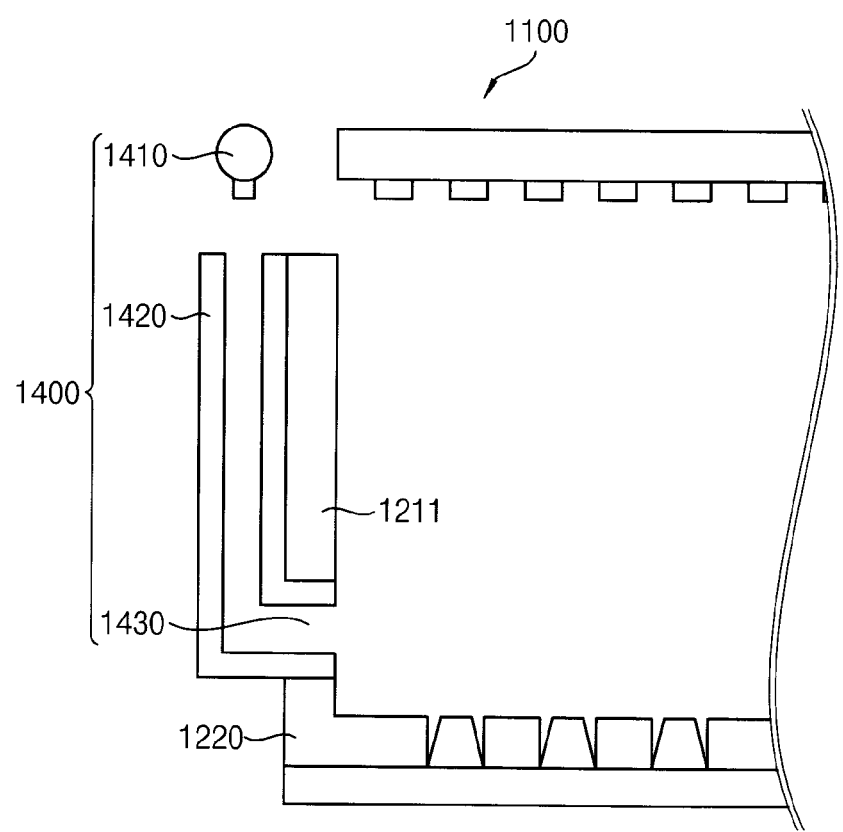
FIG. 10 is a cross-sectional view illustrating an exemplary embodiment of a side supply part engaged with the receiving container of FIG. 8.

FIG. 8 is a cross-sectional view illustrating another exemplary embodiment of an etching part in accordance with the invention. FIG. 9 is a front view illustrating an exemplary embodiment of a first side wall of a receiving container in the etching part of FIG. 8. FIG. 10 is a cross-sectional view illustrating an exemplary embodiment of a side supply part engaged with the receiving container of FIG. 8. The etching apparatus illustrated in FIG. 8 to FIG. 10 is substantially the same as the etching apparatus according to the previous exemplary embodiment except for the first side wall, a second side wall, a side through holes and the side supply part, and thus same reference numerals are used for same elements and repetitive explanation will be omitted.

Referring to FIGS. 8 and 9, another exemplary embodiment of a receiving container 1200 according to the invention includes a first side wall 1211, and a second side wall 1212 opposing the first side wall 1211. A plurality of side through holes 1231 is defined in the lower portion of the first side wall 1211. A plurality of side through holes 1231 is also defined in the lower portion of the second side wall 1212. While an individual side through hole is labeled as 1231, reference numeral 1231 may also collectively refer to the plurality of side through holes.

The receiving container 1200 of the etching part 10 includes the first and second opposing side walls 1211 and 1212, third and fourth opposing side walls (not shown) and a bottom plate 1220. Through holes may not be defined in the third and fourth opposing side walls. The receiving container 1200 receives one or more substrate and may transfer the one or more substrate in and/or out of the etching part 10. The receiving container 1200 receives the etchant, and thus the etching is performed in the receiving container 1200. That is, the receiving container 1200 serves as an etching bath. The first and second side walls 1211 and 1212 and the third and fourth side walls extend in a vertical direction with respect to the bottom plate 1220 to form a receiving space of the receiving container 1200. With reference to the view in FIG. 8, a portion of a collective side wall member of the receiving container 1200 includes the first side wall 1211 disposed on the left side of the receiving container 1200 and the second side wall 1212 disposed on the opposing right side of the receiving container 1200. The first side wall 1211 includes the plurality of side through holes 1231 defined in the lower portion of the first side wall 1211. The second side wall 1212 includes the plurality of side through holes 1231 disposed in the lower portion of the second side wall 1212. The side through holes 1231 may be fluidly, physically and/or electrically engaged with the side supply part 1400. Thus, the etchant may be supplied to the receiving container 1200 through the side through holes 1231.

Referring to FIG. 10, the side supply part 1400 of the etching part 10 includes one or more second spraying unit 1410, one or more body part 1420 and one or more injection portion 1430. While an individual second spraying unit, body part and injection part are respectively labeled as 1410, 1420 and 1430, reference numerals 1410, 1420 and 1430 may also collectively refer to a plurality of second spraying units, body parts 1420 and injection parts 1430 of the side supply part 1400. The second spraying unit 1410 supplies the etchant from the storage tank 40. The second spraying unit 1410 supplies the etchant to the body part 1420. An upper portion of the body part 1420 is open so as to expose an interior of the body part 1420 to an exterior thereof. A first spraying unit 1100 may be substantially the same as the first spraying unit 100 of the previous exemplary embodiment.

The injection portion 1430 is disposed on a lower portion of the body part 1420 and at an opposite end of the body part 1420 from the upper portion. The injection portion 1430 may be fluidly, physically and/or electrically engaged with the side through holes 1231 disposed in the respective lower portion of the first side wall 1211 and the second side wall 1212. The second spraying unit 1410 supplies the etchant from a position located over the body part 1420 in the cross-sectional view. The etchant supplied from the second spraying unit 1410 is supplied to the receiving container 1200 through the injection portion 1430 of the body part 1420. Since the injection portion 1430 is with the side through holes 1231, the injection portion 1430 corresponds in shape, size and/or number to the side through hole 1231. That is, a plurality of injection portions 1430 may be defined in the body part 1420 to correspond to the plurality of side through holes 1231.

The side supply part 1400 is separated with the receiving container 1200. That is, the side supply part 1400 may be engaged with the receiving container 1200, for example, as illustrated in FIG. 10. The side supply part 1400 may be disengaged from the receiving container 1200, for example, as illustrated in FIG. 8. When etching of one or more substrate begins, the side supply part 1400 is engaged with the receiving container 1200. When the side supply part 1400 is engaged with the receiving container 1200, the etchant is supplied by the second spraying unit 1410. As shown in FIG. 10, a portion of the body part 1420 which defines the injection part 1430 may be inserted into the side through hole 1231, such that the side supply part 1400 is engaged with the receiving container 1200.

In the illustrated exemplary embodiment, the first spraying unit 1100 supplies the etchant from a position over the receiving container 1200, and the second spraying unit 1410 supplies the etchant from a position effectively under the receiving container 1200. Thus, the flow of the etchant from multiple directions may be generated effectively. In an alternative exemplary embodiment, the first spraying unit 1100 is controlled such that only the second spraying unit 1410 may supply the etchant to the receiving container 1200. When only the second spraying unit 1410 supplies the etchant, the etchant is supplied by a force such as from hydraulic pressure.

Figure 11:
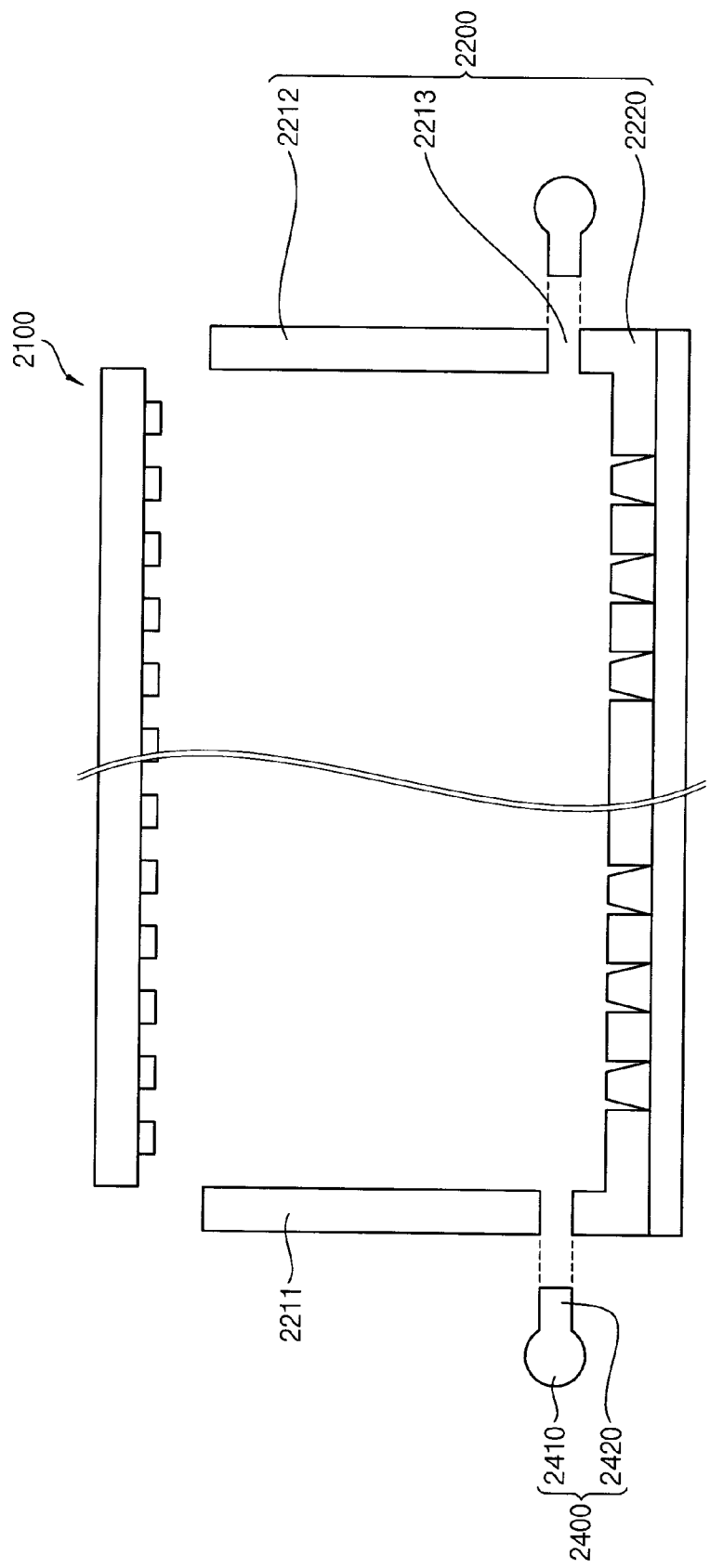
FIG. 11 is a cross-sectional view illustrating still another exemplary embodiment of an etching part in accordance with the invention.
Figure 12:
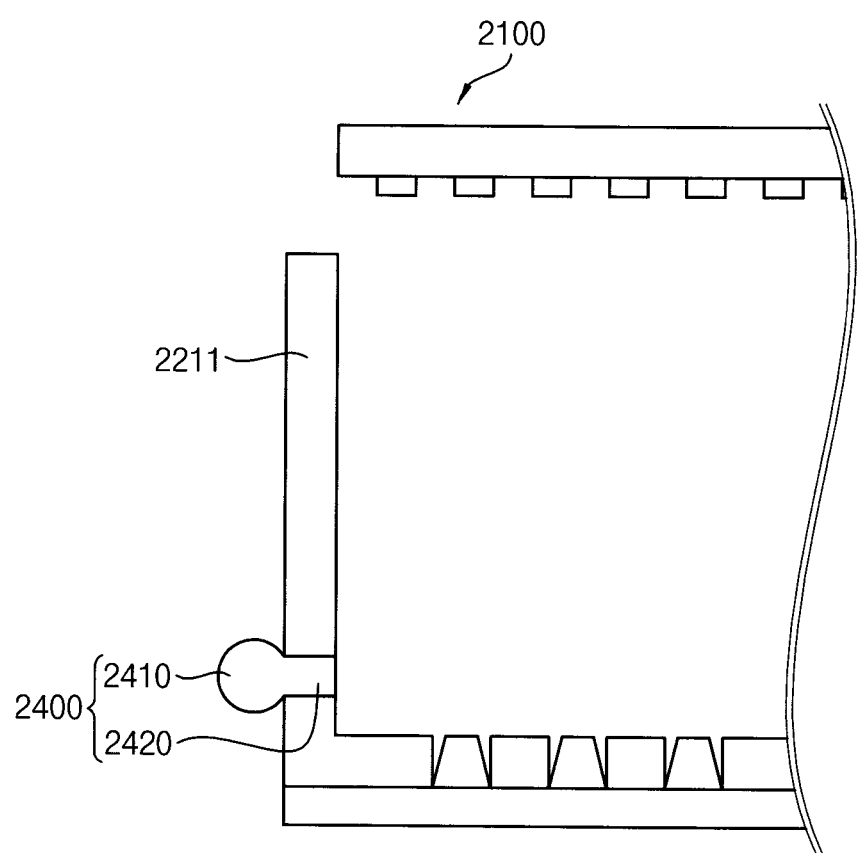
FIG. 12 is a cross-sectional view of an exemplary embodiment of a second spraying unit engaged with a receiving container in the etching part of FIG. 11.

FIG. 11 is a cross-sectional view illustrating still another exemplary embodiment of an etching part in accordance with the invention. FIG. 12 is a cross-sectional view an exemplary embodiment of a second spraying unit engaged with a receiving container of FIG. 11. The etching apparatus illustrated in FIG. 11 and FIG. 12 is substantially the same as the etching apparatus according to the previous exemplary embodiment except for a first side wall, a second side wall, side through holes and the second spraying unit, and thus same reference numerals are used for same elements and repetitive explanation will be omitted.

Referring to FIG. 11, the receiving container 2200 includes a collective side wall member and a bottom plate 2220. The receiving container 2200 receives the etchant, and thus the etching may be performed in the receiving container 2200. That is, the receiving container 2200 serves as an etching bath. The collective side wall member extends in a vertical direction with respect to the bottom plate 2220 to form a receiving space. With reference to the view in FIG.

11, the collective side wall member includes a first side wall 2211 disposed on the left side of the receiving container 2200, and a second side wall 2212 disposed on the opposing right side of the receiving container 2200. The first side wall 2211 includes a plurality of side through holes 2213 defined in the lower portion of the first side wall 2211. The second side wall 2212 includes a plurality of side through holes 2213 defined in the lower portion of the second side wall 2212. A second spraying unit 2400 may be engaged with and disengaged from the side through holes 2213. Thus, the etchant may be supplied to the receiving container 2200 through the side through holes 2213.

Referring to FIG. 12, the second spraying unit 2400 includes one or more supply pipe 2410 and one or more spraying nozzle 2420. While an individual supply pipe and an individual spray nozzle is labeled as 2410 and 2420, respectively, reference numerals 2410 and 2420 may also collectively refer to the plurality of supply pipes and the plurality of nozzles. The supply pipe 2410 supplies the etchant from the storage tank 40. The supply pipe 2410 supplies the etchant to the spraying nozzle 2420. Since the spraying nozzle 2420 is engaged with the side through holes 2213, the spraying nozzles 2420 corresponds in shape, size and or number to the side through holes 2213. That is, the second spraying unit 2400 may include a plurality of spraying nozzles 2420 to correspond to the plurality of side through holes 2213. A first spraying unit 2100 may be substantially the same as the first spraying unit 100 of FIG. 2.

Figure 13:
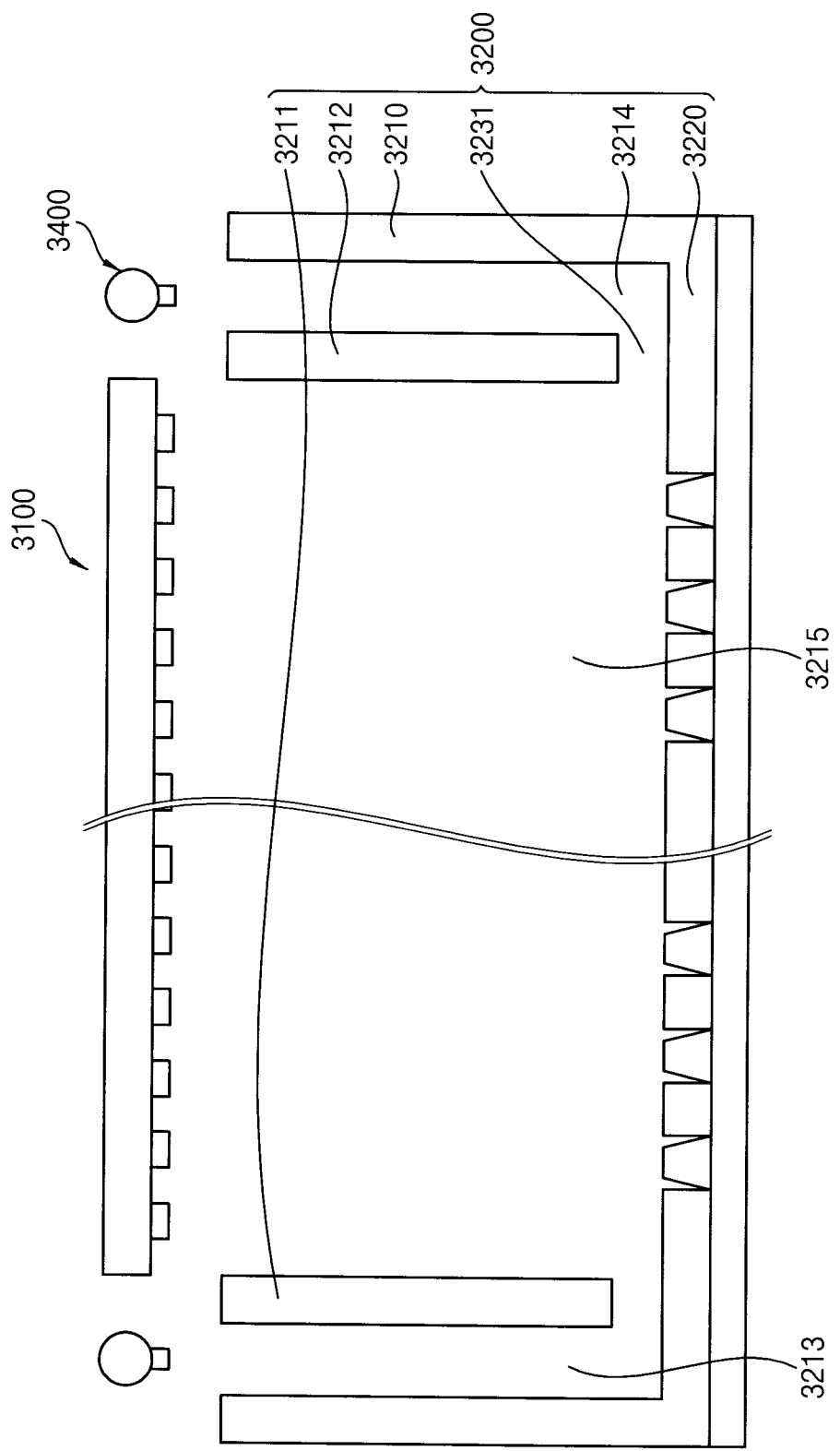
FIG. 13 is a cross-sectional view illustrating yet another exemplary embodiment of an etching part in accordance with the invention.

The second spraying unit 2400 is separated with the receiving container 2200. That is, the second spraying unit 2400 may be engaged with the receiving container 2200, for example, as illustrated in FIG. 12. The second spraying unit 2400 may be disengaged from the receiving container 2200, for example, as illustrated in FIG. 11. When etching of one or more substrate begins, the second spraying unit 2400 is engaged with the receiving container 2200. When the second spraying unit 2400 is engaged with the receiving container 2200, the etchant is supplied by the spraying nozzle 2420. In the illustrated exemplary embodiment, the first spraying unit 2100 supplies the etchant over the receiving container 2200, and the second spraying unit 2400 supplies the etchant effectively under the receiving container 2200. Thus, the flow of the etchant may be generated effectively. As shown in FIG. 13, a portion of the spraying nozzle 2420 may be inserted into the side through hole 2213, such that the second spraying unit is engaged with the receiving container 2200.

In an alternative exemplary embodiment, the first spraying unit 2100 may be controlled such that only the second spraying unit 2400 may supply the etchant to the receiving container 2200. When only the second spraying unit 2400 supplies the etchant, the etchant is supplied by the second spraying unit 2400.

FIG. 13 is a cross-sectional view illustrating yet another exemplary embodiment of an etching part in accordance with the invention. The etching apparatus illustrated in FIG. 13 is substantially same as the etching apparatus according to the previous exemplary embodiment except for a first side wall, a second side wall, side through holes and a second spraying unit, and thus same reference numerals are used for same elements and repetitive explanation will be omitted.

Referring to FIG. 13, a receiving container 3200 includes a side wall member 3210, a bottom plate 3220, a first inside wall 3211 and a second inside wall 3212. The first inside wall 3211 and the second inside wall 3212 are disposed inside of the side wall member 3210, such that the left and right side wall portions of the receiving container 3200 have a double side wall structure. A first inside space 3213, a second inside space 3214 and a third inside space 3215 are defined by the first the side wall member 3210, the inside wall 3211 and the second inside wall 3212. One or more substrate is received in the third inside space 3215, and the etching is performed in the third inside space 3215. A plurality of side through holes 3231 is defined in a position effectively under the first inside wall 3211 and the second inside wall 3212. The etchant is transferred through the side through holes 3231.

A second spraying unit 3400 is disposed over the first inside space 3213 and the second inside space 3214. While an individual second spraying unit is labeled as 3400, reference numeral 3400 may also collectively refer to a plurality of second spraying units. A first spraying unit 3100 is disposed over the third inside space 3215, and is substantially similar to the first spraying unit 100 in FIG. 2. In the illustrated exemplary embodiment, the first spraying unit 3100 supplies the etchant from a position over the receiving container 3200, and the second spraying unit 3400 supplies the etchant from a position effectively under the receiving container 3200. Thus, the flow of the etchant from and in multiple directions may be generated effectively. In an alternative exemplary embodiment, the first spraying unit 3100 is controlled such that only the second spraying unit 3400 may supply the etchant to the receiving container 3200. When only the second spraying unit 3400 supplies the etchant, the etchant is supplied by a force such as from hydraulic pressure.

According to one or more exemplary embodiment, the etching of one or more substrate is performed in the receiving container which functions as an etching bath, and thus a plurality of substrates may be etched simultaneously to improve productivity of an etching process. The receiving container performs multiple functions of receiving the substrate, and transferring the one or more substrate and the etching bath to and from the etching part, and thus a manufacturing cost may be reduced.

In addition, the first spraying unit supplies the etchant from a position over the receiving container, and the second spraying unit supplies the etchant from a position effectively under the receiving container. Thus, the flow of the etchant from and in multiple directions may be generated effectively. Accordingly, the impurities from the etchant drained from the receiving container are not adhered to the one or more substrate by the flow of the etchant in the receiving container, and thus the one or more substrate may be etched effectively.

In addition, the spraying unit, and the opening and closing driving part may be controlled such that a uniform and/or continuous flow of the etchant may be contacted with the one or more substrate. Accordingly, the uniformity of the etching may be improved.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifies to the disclosed exemplary embodiments, as well as other exemplary embodiments, are intended to be included within the scope of the appended claims. The invention is defined by the following claims, with equivalents of the claims to be included therein.

What is claimed is:

1. An etching apparatus comprising:
a receiving container inside which is received a substrate and comprises:
 a bottom plate, and a plurality of bottom through holes defined in the bottom plate and through which an etchant is drained from the receiving container; and
 a plurality of side walls extended from the bottom plate;
a first spraying unit which supplies the etchant into the receiving container; and
an opening and closing driving part comprising a plurality of protruding portions configured to move together to be respectively engaged with an inside of the bottom through holes defined in the bottom plate to open and close the bottom through holes defined in the bottom plate, wherein the etchant remains outside the opening and closing driving part engaged with the inside of the bottom through holes defined in the bottom plate.

2. The etching apparatus of claim 1, wherein the first spraying unit comprises:
a supply pipe which is provided over the bottom plate of the receiving container and supplies the etchant; and
a plurality of spraying nozzles respectively connected to the supply pipe and facing the bottom plate of the receiving container.

3. The etching apparatus of claim 1, wherein the plurality of protruding portions of the opening and closing driving part together move up and down with respect to the bottom plate of the receiving container to open and close the bottom through holes defined in the bottom plate.

4. The etching apparatus of claim 3, further comprising:
a settling tank under the receiving container and in which an impurity in the etchant drained from the receiving container is settled;
a filter part which is connected with the settling tank and filters the etchant drained from the settling tank; and
a storage tank which is connected with the filter part, stores etchant drained from the filter part and supplies etchant stored in the storage tank to the first spraying unit.

5. The etching apparatus of claim 1, further comprising:
a plurality of side through holes defined in a side wall of the receiving container at a lower portion of the sidewall, through which an inside of the receiving container is exposed to outside the receiving container; and
a side supply part disposed outside the receiving container, engaged with side through holes through which the inside of the receiving container is exposed to outside the receiving container, to supply the etchant through the side through holes to the receiving container from the outside thereof.

6. The etching apparatus of claim 5, wherein the side supply part comprises:
a body part disposed outside of and facing the side wall of the receiving container;
a plurality of injection portions extending from the body part disposed outside the receiving container, the plurality of injection portions configured to be inserted into the side through holes from outside the receiving container, respectively; and
a second spraying unit disposed outside the receiving container, which supplies the etchant to the receiving container via the body part disposed outside the receiving container.

7. The etching apparatus of claim 6, wherein the plurality of protruding portions of the opening and closing driving part together move up and down with respect to the bottom plate of the receiving container to open and close the bottom through holes defined in the bottom plate.

8. The etching apparatus of claim 7, further comprising;
a settling tank under the receiving container and in which an impurity in the etchant drained from the receiving container is settled;
a filter part which is connected with the settling tank and filters the etchant drained from the settling tank; and
a storage tank which is connected with the filter part, stores the etchant drained from the filter part and supplies the etchant stored in the storage tank to the first spraying unit.

9. The etching apparatus of claim 1, further comprising:
a plurality of side through holes defined in a side wall of the receiving container at a lower portion of the side wall, through which an inside of the receiving container is exposed to outside the receiving container; and
a second spraying unit disposed outside the receiving container, engaged with the side through holes through which the inside of the receiving container is exposed to outside the receiving container, to spray the etchant into the receiving container from outside the receiving container via the side through holes defined in the side wall.

10. The etching apparatus of claim 9, wherein the second spraying unit comprises:
a supply pipe which is disposed outside of and adjacent to the side wall of the receiving container and supplies the etchant; and
a plurality of spraying nozzles connected to the supply pipe, disposed outside of the receiving container and configured to engage with the side through holes defined in the receiving container.

11. The etching apparatus of claim 10, wherein the plurality of protruding portions of the opening and closing driving part together move up and down with respect to the bottom plate of the receiving container to open and close the bottom through holes defined in the bottom plate.

12. The etching apparatus of claim 11, further comprising:
a settling tank under the receiving container and in which an impurity in the etchant drained from the receiving container is settled;
a filter part which is connected with the settling tank and filters the etchant drained from the settling tank; and
a storage tank which is connected with the filter part, stores the etchant drained from the filter part and supplies the etchant stored in the storage tank to the first and the second spraying unit.

13. An etching apparatus comprising:
a receiving container which receives a substrate and comprises:
 a bottom plate, and a plurality of bottom through holes defined in the bottom plate and through which an etchant is drained from the receiving container;
 a plurality of side walls extended from the bottom plate;
 a first inside wall inside the side walls, and a plurality of side through holes defined in a lower portion of the first inside wall and through which the etchant is supplied to the receiving container; and a second inside wall inside the side walls and facing the first inside wall, and the plurality of side through holes defined in a lower portion of the second inside wall and through which the etchant is supplied to the receiving container;

a first spraying unit which supplies the etchant into the receiving container;

a second spraying unit which is disposed outside of the receiving container and adjacent to the first spraying unit, faces a side wall of the receiving container and supplies the etchant into the receiving container; and an opening and closing driving part comprising a plurality of protruding portions configured to move together to be respectively engaged with an inside of the bottom through holes defined in the bottom plate to open and close the bottom through holes defined in the bottom plate, wherein the etchant remains outside the opening and closing driving part engaged with the inside of the bottom through holes defined in the bottom plate.

14. The etching apparatus claim 13, wherein the plurality of protruding portions of the opening and closing driving part together move up and down with respect to the bottom plate of the receiving container to open and close the bottom through holes defined in the bottom plate.

15. The etching apparatus of claim 14, further comprising:

a settling tank under the receiving container and in which an impurity in the etchant drained from the receiving container is settled;

a filter part which is connected with the settling tank and filters the etchant drained from the settling tank; and a storage tank which is connected with the filter part, stores the etchant drained from the filter part and supplies the etchant stored in the storage tank to the first and the second spraying unit.

* * * * *